United States Patent [19]

Heigl

[11] Patent Number: 4,768,638

[45] Date of Patent: Sep. 6, 1988

[54] DEVICE TO PRECISELY RELEASE INDIVIDUAL ELECTRICAL COMPONENTS

[76] Inventor: Helmut Heigl, Anton-Fahrner-Strasse 1, 8208 Pullach-Kolbermoor, Fed. Rep. of Germany

[21] Appl. No.: 879,098

[22] Filed: Jun. 26, 1986

[30] Foreign Application Priority Data

Jun. 26, 1985 [DE] Fed. Rep. of Germany ....... 3522877

[51] Int. Cl.⁴ ............................................. B65G 47/46
[52] U.S. Cl. .................................... 198/359; 198/370; 193/14; 221/68
[58] Field of Search ................. 221/68, 176, 292, 298, 221/301; 209/573; 193/14, 23; 198/370, 359

[56] References Cited

U.S. PATENT DOCUMENTS

| 558,057 | 4/1896 | Ferguson | 221/298 X |
| 4,234,418 | 11/1980 | Boissicat | 209/573 X |
| 4,588,092 | 5/1986 | Moechnig et al. | 324/158 F X |

FOREIGN PATENT DOCUMENTS

| 3340182 | 5/1985 | Fed. Rep. of Germany | 209/573 |
| 1025605 | 6/1983 | U.S.S.R. | 209/573 |

Primary Examiner—F. J. Bartuska
Attorney, Agent, or Firm—Steele, Gould & Fried

[57] ABSTRACT

A device for precisely releasing individual electrical components, especially electronic integrated circuits (IC's) to sort, position and/or store the components on a slanted work table, without relative friction between connector pins, soldering terminals and stop strips, and to avoid exerting lateral pressure causing the pins or the like to become deformed, a positioning section is designed as a supporting cap with a leading edge, behind which a component to be released is loaded from the rear. The supporting cap tilts relative to a supporting surface by means of a fitting that permits lateral movement of the component, and upon tilting of the cap releases of the component where desired.

9 Claims, 2 Drawing Sheets

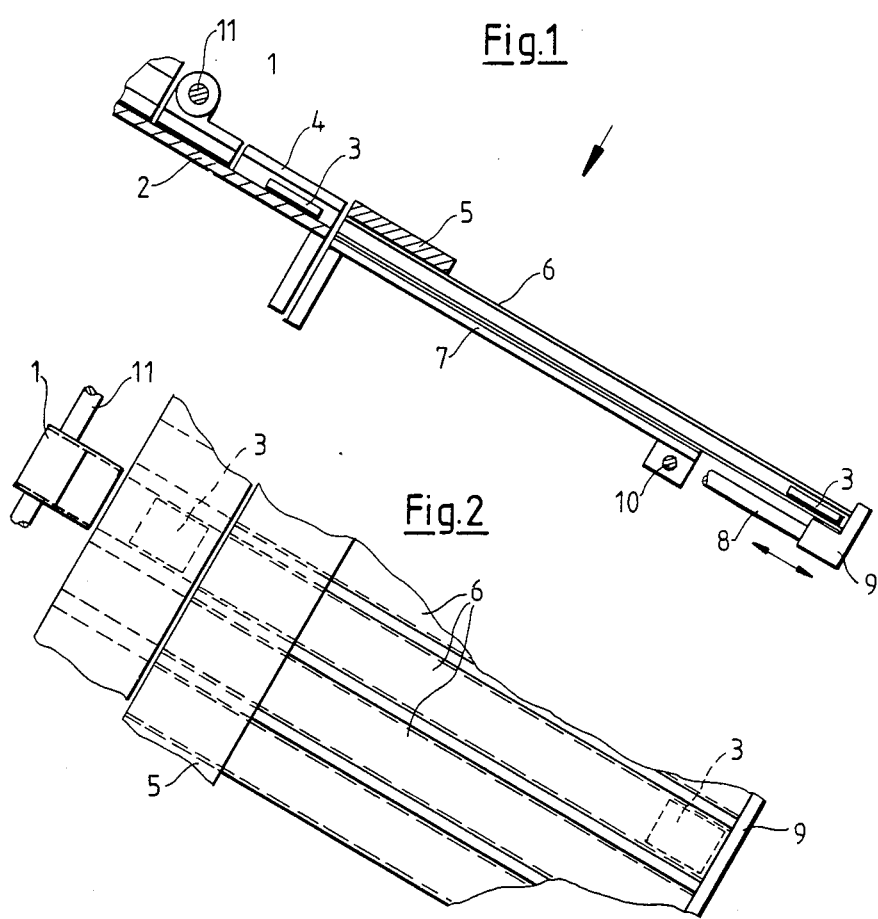

DEVICE TO PRECISELY RELEASE INDIVIDUAL ELECTRICAL COMPONENTS

BACKGROUND OF THE INVENTION

1. Field of the Invention

This invention refers to a device to precisely position and release individual electrical components, especially electronic integrated circuits (IC's). The device has an adapter for the IC's with a supporting cap having a leading edge behind which the component is to be inserted. The supporting cap is movably carried on a guide that enables transverse positioning of the component with respect to a feed direction, while retaining alignment of the component.

Positioning devices are useful for sorting prefabricated IC's, for example in view of their electrical characteristics, and are useful for positioning such components in factory processes, for example assembly of circuit boards. Positioning devices are especially useful for loading components into IC rods, i.e., shaped tubes in which a number of IC's are stored in a line one behind another.

2. Prior Art

Devices for precisely releasing electronic integrated circuits are already well known. The individual components to be fed and released, which are shaped generally like small blocks with square surfaces, have protruding connector pins, soldering terminals, etc., which make it necessary that the components be moved about without any pressure exerted, especially lateral pressure, that would disturb pin alignment. The IC's may be moved on an inclined plane and released at a precise position, whereby under the force of gravity they slide into positions required for processing, for example for storage. In this manner, conveying devices with claw feed parts and similar possibly-damaging elements are eliminated.

Standard release devices may have a guiding device having a shoulder defining a path along which the individual circuits are brought to a predetermined position. A front barrier is then moved clear of the path, so that the components can slide into the next required position by their own weight.

The disadvantage of such release devices is that the components with their connector pins, soldering terminals, etc., have to be guided along the shoulder and caused to glide smoothly along the shoulder. This requires a relative movement of frictionally-engaged surfaces, which can lead to damage to connector pins or soldering terminals, and can also lead to the components being tilted or turned.

It is important that damage be avoided, and a tested IC must be treated very carefully. If a damaged IC is installed in a circuit, the damage cannot readily be detected, but only becomes apparent when a possibly complex circuit is placed into operation. Localizing and correcting the damage then leads to very time consuming and expensive repair work.

SUMMARY OF THE INVENTION

It is an object of this invention to provide a device for precise release of electronic components, by which the individual components can be moved laterally without damage caused by relative movement over a mounting and holding device, and such that when the components are released onto a tilted gliding table, no unevenness must be passed over and no torsion or tilting of the components occurs.

This object is achieved with a device for precisely positioning and releasing individual electronic components, especially electronic integrated circuits (IC's), on a slanted work table having an upper surface on which a component is rested, the device having an adapter with a supporting cap defining a receptacle for the component, the cap having a leading supporting edge behind which the component to be positioned and released is first inserted from the rear, and a guide bar shaft carrying the supporting cap, the cap being transversely movable along the axis of the guide bar for positioning a component, and rotatable upwardly from the slanted work table to release the component. Especially advantageous embodiments of the device include an embodiment in which the supporting cap has lateral edges that together with the leading supporting edge define a partial enclosure. These lateral edges are spaced closer to the work table than the leading supporting edge. The lateral edges can be, for example, higher that the leading supporting edge by about half the thickness of the individual components. The supporting cap can be fixed on the guide bar to be rotatable about an axis of the guide bar, and made longitudinally slidable along the guide bar, in a manner that retains the alignment of the supporting cap with respect to the axis of the guide bar. Preferably, the supporting cap is interchangeable with additional supporting caps adapted to receive components of other sizes.

According to the invention the guide mechanism for a component to be released is arranged as a supporting cap provided with a leading edge, the cap being in the shape of a tiltable cover placed over the component. The component-retaining structure can be moved sideways (i.e., transverse to the feed direction defined by the tilting table) along the guide bar shaft. If and/or when required, the component is released through upward tilting movement of the component-retaining structure, upwardly from the table.

The initial position at which the components are released and start to slide, and therefore the initial position of ingress to processing equipment and/or storage means such as an IC rod or the like, is absolutely correct, because the component is first held in place at the precise release position defined by the supporting cap, and correctly transported through its own weight.

BRIEF DESCRIPTION OF THE DRAWINGS

Details of a device according to a preferred embodiment of the invention are explained below in connection with the attached drawings, wherein:

FIG. 1 is a side sectional view of an IC storage device, at which the release device is mounted in accordance with the invention;

FIG. 2 is a partially cutaway top view of the device from the direction of the arrow in FIG. 1;

DETAILED DESCRIPTION OF THE PREFERRED EMBODIMENTS

Figure 3:
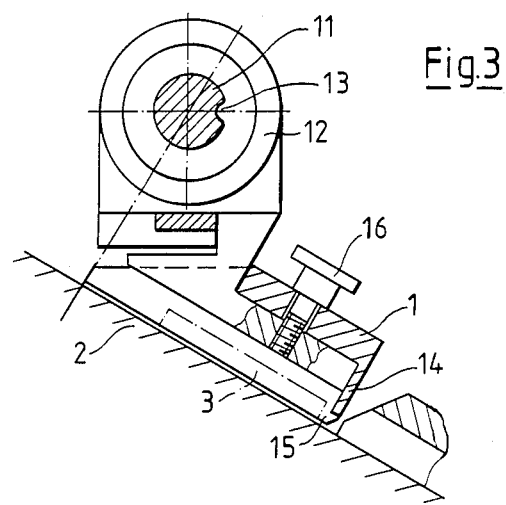
FIG. 3 is a side view of the release device in its retracted position.

FIGS. 1 and 2 illustrate a device in accordance with the invention for precise release of individual components, especially IC's. The release device in the drawings is indicated generally as 1. From the upper left in FIGS. 1 and 2, or on the left side, individual IC's are inserted into release device 1. The release device is laterally movable along shaft 11, as shown in FIG. 2, to thereby guide the release device and the IC or other component carried therein to a desired position. The device may be moved, for example, to a position over one of the IC rods 6, positioned parallel to one another, and in which the individual released IC's are to be stored.

The apparatus actually releases an individual IC 3 or other part by tilting the release device counterclockwise around shaft 11 (see FIG. 1). The IC is thus released by removal of the release device, which defines a receptacle for the IC and blocks its movement, whereupon the IC glides downwardly into shaft 4. Shaft 4 may be, for example, a scanning apparatus that optically or otherwise detects the part before it slides into one of the rods 6, the part passing along a path indicated by the dotted lines in FIG. 2.

The IC rods 6 are supported in position on a table 7 under a holding strip 5 and at a lower end of the table. The rods may be supported on a holding strip 9, which is part of the frame. Holding strip 9 also stops the components from falling out the far ends of the IC rod 6. Table 7 is offset such that its surface opposite the base 2 is low enough that the component passing into IC storage rod 6 finds a smooth sliding path.

Figure 4:
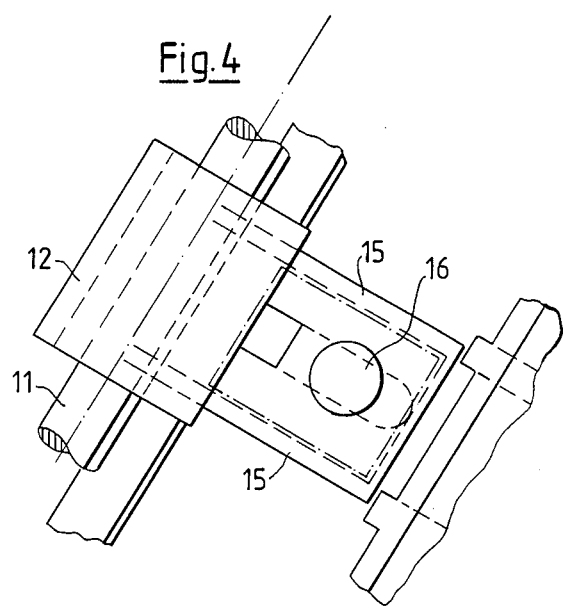
FIG. 4 is a top view of the device as shown in FIG. 3.
Figure 5:
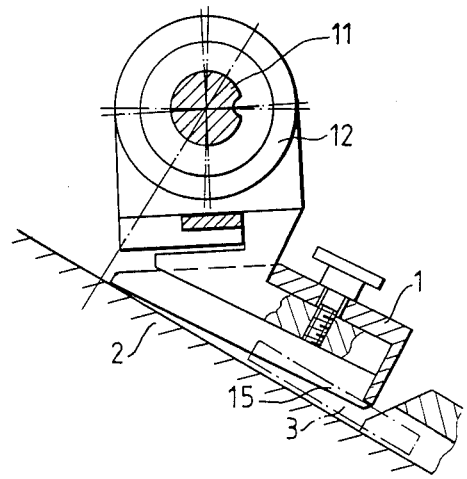
FIG. 5 is a side view of the release device according to FIG. 3, in raised position during release of an individual IC.

FIGS. 3–5 show the release device in detail, the part shown and discussed with respect to FIGS. 1 and 2 being shown in FIGS. 3 and 5 using the same reference numerals.

The release device 1 has a leading edge 14, as well as lateral edges 15, the edges enclosing around the IC. The leading edge 14 does not extend down as far as the lateral edges 15. However, edge 15 extends far enough that the component 3, such as an IC, which is inserted from the left, rests against or close to the inner face of the leading edge, whereupon the component cannot slide downward any further. The release section 1 is attached to shaft 11 along a bushing 12. Shaft 11 has a longitudinal slot by which rotation can be transferred to the bushing 12, whereby the release section 1 can be tilted upwardly. In other words, release section 1 is rotatably fixed to shaft 11 but is longitudinally movable on shaft 11, such that release device 1 can be moved along shaft 11, i.e., lateral to the feed direction, to a correct release position. Then upon rotation of shaft 11 release device 1 will be lifted from the IC, allowing it to slide along a desired path.

FIG. 5 shows the release section 1 in an upward tilted position, whereby the component 3 (such as an IC) has already slipped under the retaining leading edge and holding strip 5.

It will be seen from the illustrations that any connecting pins, soldering terminals, etc., are not subject to relative movement across machine parts, even if the release device 1 is moved along the shaft 11 by a drive (not shown). The release device holds IC 3 and supports it during transit.

The component-holding part of the releasing device is preferably interchangeable with similar devices in other sizes, such that components of differing sizes and thicknesses can be positioned and held with the releasing device. Accordingly, the supporting cap 1 can be removed for exchange by loosening the knurled head screw 16.

The foregoing invention has been explained by way of a concrete preferred embodiment that has proven especially useful. This preferred embodiment should be considered an example only. Skilled persons will now appreciate that certain features can be varied within the invention. A swivel movement in the direction of the release is also possible for the slide mechanism on the bushing 12. The device can have adjustable shafts, and also can be driven using toothed belts. The shape of the locking wheels can be adapted without problems to the geometrical structural conditions of individual components.

I claim:

1. A device for precisely positioning and releasing individual electrical components, especially electronic integrated circuits (IC'S) comprising:
   a slanted work table having a smooth upper surface on which one of the individual components is rested, the component being adapted to slide along the work table, the work table being slanted such that the component will slide in a feed direction upon release;
   an adapter having a supporting cap defining with the work table a receptacle enclosing the component, the cap having a leading supporting edge behind which the component to be positioned and released is to be inserted from the rear;
   a guide bar carrying the supporting cap and means positioning the supporting cap along the bar on the work table, laterally of the feed direction, and the supporting cap being raisable from the work table to release the component;
   whereby the component is slidable on the table laterally of the feed direction while carried in the supporting cap, and released for movement in the feed direction by raising the supporting cap.

2. The device of claim 1, wherein the supporting cap has lateral edges, the component being supported between the lateral edges and against the supporting edge prior to release.

3. The device of claim 2, wherein the lateral edges extend farther over the component than the leading edge.

4. The device of claim 3, wherein the lateral edges are higher that the leading edge by about one half a thickness of the component.

5. The device of claim 1, wherein the supporting cap remains aligned to the feed direction and is movable along an axis defined by the guide bar.

6. The device of claim 1, wherein the supporting cap is interchangeable with additional supporting caps adapted for additional electrical components.

7. A device for feeding electrical components, especially integrated circuits, comprising:
   a smooth work table slanted such that the electrical components will slide across the work table in a feed direction when released;
   a guide bar extending over the work table laterally of the feed direction; and,
   a supporting cap carried on the guide bar, the supporting cap defining a receptacle for the components and having a leading edge restraining successive ones of the components in the feed direction, the supporting cap being movable along an axis parallel to the guide bar, transverse to the feed direction, and the supporting cap being liftable from the work table to release the component;

whereby successive ones of the components are laterally positioned on the work table by sliding over the work table, each said component resting on the work table.

8. The device of claim 7, wherein the work table carries a plurality of IC tubes spaced laterally of the feed direction, the components to be sorted into the IC tubes, and further comprising means for sliding the supporting cap along the guide bar, the supporting cap being rotationally affixed to the guide bar to rotate with the guide bar and slidable on an axis of the guide bar, and means for controllably rotating the guide bar.

9. The device of claim 7, wherein the components are integrated circuits having pins resting on said work table.

* * * * *